(12) United States Patent
Niki (10) Patent No.: US 8,027,169 B2
(45) Date of Patent: Sep. 27, 2011

(54) MULTILAYER PRINTED WIRING BOARD FOR SEMICONDUCTOR DEVICES AND METHOD FOR MANUFACTURING THE BOARD

(75) Inventor: Ayao Niki, Ogaki (JP)

(73) Assignee: Ibiden Co., Ltd., Ogaki (JP)

( * ) Notice: Subject to any disclaimer, the term of this patent is extended or adjusted under 35 U.S.C. 154(b) by 789 days.

(21) Appl. No.: 11/555,881

(22) Filed: Nov. 2, 2006

(65) Prior Publication Data

US 2007/0263370 A1 Nov. 15, 2007

(30) Foreign Application Priority Data

Nov. 2, 2005 (JP) ................................. 2005-319432

(51) Int. Cl.
*H05K 7/00* (2006.01)
(52) U.S. Cl. .................. 361/760; 361/763; 174/255
(58) Field of Classification Search .................. 361/760, 361/783; 174/255
See application file for complete search history.

(56) References Cited

U.S. PATENT DOCUMENTS

| | | | |
|---|---|---|---|
| 6,342,682 B1 * | 1/2002 | Mori et al. | 174/262 |
| 6,548,767 B1 | 4/2003 | Lee et al. | |
| 6,828,510 B1 * | 12/2004 | Asai et al. | 174/255 |
| 6,931,724 B2 | 8/2005 | Rokugawa et al. | |
| 7,157,796 B2 | 1/2007 | Yamagata | |
| 2003/0121700 A1 | 7/2003 | Schmidt | |
| 2004/0211751 A1 | 10/2004 | Shuto et al. | |
| 2005/0016768 A1 | 1/2005 | Zollo et al. | |
| 2005/0230711 A1 | 10/2005 | Chang et al. | |
| 2005/0231889 A1 | 10/2005 | Tsuji | |
| 2009/0078451 A1 | 3/2009 | Niki et al. | |

FOREIGN PATENT DOCUMENTS

| | | |
|---|---|---|
| JP | 2000-323613 | 11/2000 |
| JP | 2002-83893 | 3/2002 |
| JP | 2002-151853 | 5/2002 |
| JP | 2004-265967 | 9/2004 |

\* cited by examiner

*Primary Examiner* — Yuriy Semenenko
*Assistant Examiner* — Andargie M Aychillhum
(74) *Attorney, Agent, or Firm* — Oblon, Spivak, McClelland, Maier & Neustadt, L.L.P.

(57) ABSTRACT

A multilayer printed wiring board includes one or more resin layers having via-holes and a core layer having via-holes. The via-holes formed in the one or more resin layers are open in the direction opposite to the direction in which the via-holes formed in the core layer are open. A method for manufacturing a multilayer printed wiring board includes a step of preparing a single- or double-sided copper-clad laminate; a step of forming lands by processing the copper-clad laminate; a step of forming a resin layer on the upper surface of the copper-clad laminate, forming openings for via-holes in the resin layer, and then forming the via-holes; and a step of forming openings for via-holes in the lower surface of the copper-clad laminate and then forming the via-holes.

12 Claims, 12 Drawing Sheets

FIG.2J (STEPS SHOWN IN FIGs. 2E TO 2K MAY BE REPEATED)

FIG.4J (STEPS SHOWN IN FIGs. 4E TO 4K MAY BE REPEATED)

MULTILAYER PRINTED WIRING BOARD FOR SEMICONDUCTOR DEVICES AND METHOD FOR MANUFACTURING THE BOARD

BACKGROUND OF THE INVENTION

The present application claims the benefit of priority to Japanese Patent Application No. 2005-319432, filed Nov. 2, 2005. The contents of this application are incorporated herein by reference in their entirety.

BACKGROUND OF THE INVENTION

1. Field of the Invention

The present invention relates to a multilayer printed wiring board for semiconductor devices and methods for a manufacturing such board.

2. Description of the Related Art

Japanese Laid-Open Publication No. 2000-323613 (Date of Laid-Open: Nov. 24, 2000) (corresponding to US Patent Application Publication No. US 2002/0195272 A1; Pub. Date Dec. 26, 2002) discloses a multilayer printed wiring board, having a small thickness, for semiconductor devices. The multilayer printed wiring board is manufactured in such a manner that a copper plate serving as a support is prepared, a semiconductor device-mounting layer having a surface for mounting semiconductor devices and an externally connecting layer having a surface for an external connection are formed on the copper plate. Via-holes, conductive wires, and an insulating layer are formed in that order in the direction from the semiconductor device-mounting layer to the externally connecting layer. The copper plate is then removed.

SUMMARY OF THE INVENTION

According to one aspect of the present invention, a multilayer printed wiring board, has a a core layer having an opening, and a conductive film formed on an upper surface of the core layer and closing one end of the opening of the core layer, a via-hole formed in the opening of the core layer, a first resin layer formed over the upper surface of the core layer and having openings, a via-hole formed in the opening of the resin layer. The via-holes of the one or more resin layers are open in the direction opposite to the direction in which the via-hole of the core layer is open.

According to another aspect of the present invention, a method for manufacturing a multilayer printed wiring board, includes preparing a single- or double-sided copper-clad laminate, and forming a conductive film on an upper surface of the copper-clad laminate, forming a resin layer on the upper surface of the copper-clad laminate, forming a opening for a via-hole in the resin layer, forming the via-hole in the resin layer, forming a opening for via-hole in the copper-clad laminate, forming the via-hole in the copper-clad. The via-holes formed in the resin layer are open in the direction in which the via-hole formed in the copper-clad laminate is open.

According to yet another aspect of the present invention, a coreless multilayer printed wiring board, has a coreless layer having an opening, and a conductive film formed on an upper surface of the coreless layer and closing one end of the opening of the coreless layer, a via-hole formed in the opening of the coreless layer, a first resin layer formed on the coreless layer and the conductive film and having an opening reaching to the conductive film, a via-hole formed in the opening of the first resin layer, a second resin layer formed on the upper surface of the first resin layer and having an opening, a via-hole formed in the opening of the second resin layer. The via-holes formed in the first and second resin layers are open in the direction opposite to the direction in which the via-hole formed in the third resin layer is open.

According to yet another aspect of the present invention, a method for manufacturing a multilayer printed wiring board, includes preparing a support plate, and forming a conductive film on the support plate, forming a first resin layer on the upper surface of the support plate, forming a first opening for a first via-hole in the first resin layer, forming the first via-hole in the first resin layer, forming a second resin layer on the upper surface of the first resin layer, forming a second opening for a second via-hole in the second resin layer, forming the second via-hole in the second resin layer, removing the support plate, forming a coreless layer on the lower surface of the first resin layer, forming a third opening for a third via-hole in the coreless layer, forming the third via-hole in the coreless layer. The via-holes formed in the first and second resin layers are open in the direction opposite to the direction in which the via-hole formed in the coreless layer is open.

According to another aspect of the present invention, a multilayer printed wiring board has an insulating layer having an opening, and a conductive film formed on a surface of the insulating layer and closing one end of the opening of the insulating layer, a resin layer formed over the insulating layer and the conductive film and having at least one opening, a first via-hole structure formed in the opening in the insulating layer and comprising an electroless plating film on a surface of the opening in the insulating layer and the conductive film and an electroplating film formed on the electroless plating film, at least one via-hole structure formed in the at least one opening of the resin layer and comprising an electroless plating film formed on a surface of the opening of the resin layer and an electroplating film formed on the electroless plating film.

DESCRIPTION OF THE PREFERRED EMBODIMENTS

Embodiments of the present invention will now be described in detail with reference to the accompanying drawings. In order to avoid repetition, the same components shown in the accompanying drawings shall have the same reference numerals.

First Embodiment

Figure 1:
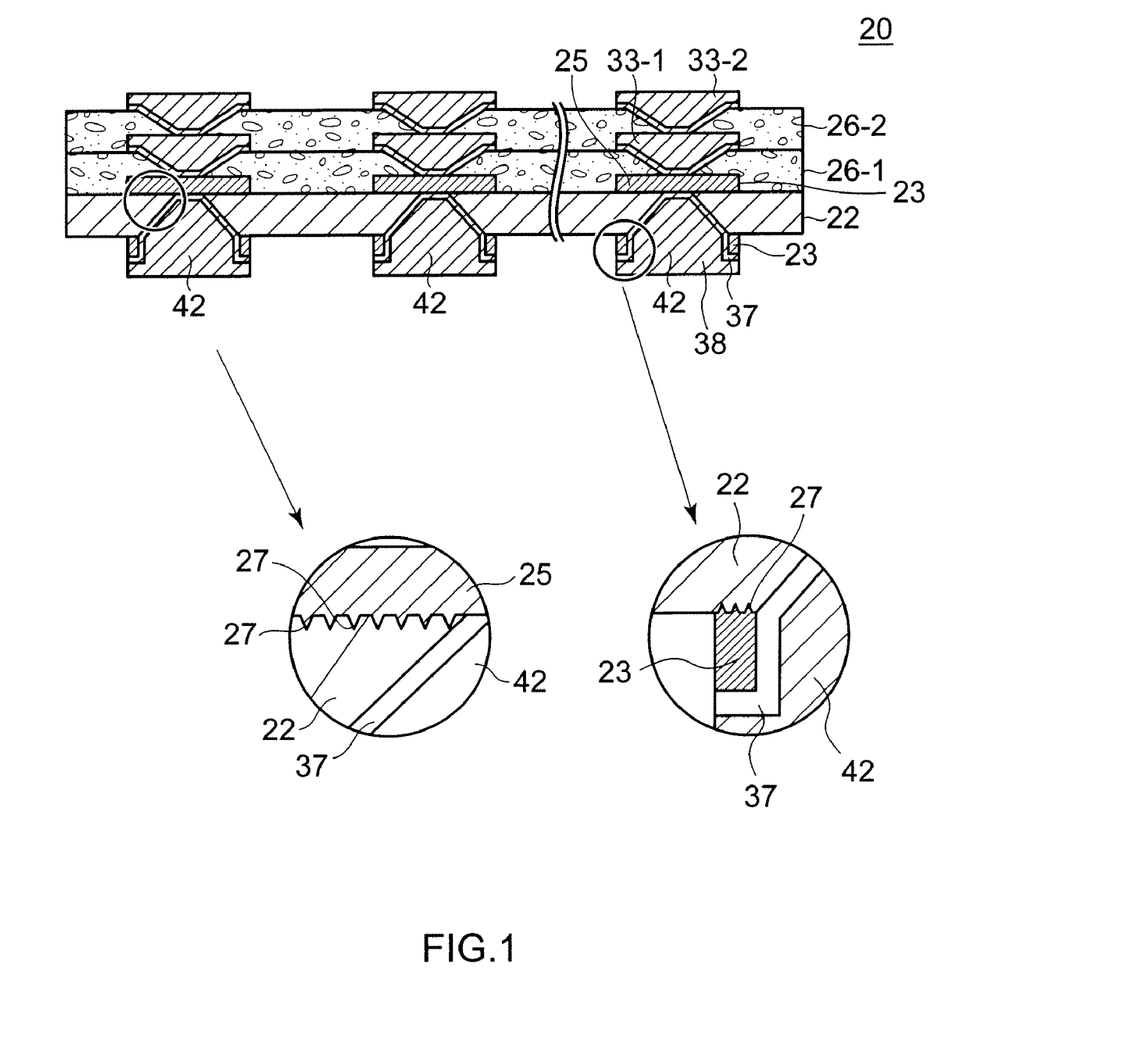
FIG. 1 is a sectional view of a multilayer printed wiring board according to a first embodiment of the present invention.

FIG. 1 shows a multilayer printed wiring board 20 according to a first embodiment of the present invention. The multilayer printed wiring board 20 of the first embodiment includes a first resin layer 26-1, first via-holes 33-1 formed in the first resin layer 26-1, a second resin layer 26-2 disposed on the upper surface of the first resin layer 26-1, second via-holes 33-2 formed in the second resin layer 26-2, a core layer 22 disposed on the lower surface of the first resin layer 26-1, and third via-holes 42 formed in the core layer 22. The first and second via-holes 33-1 and 33-2 are open in the direction opposite to the direction in which the third via-holes 42 are open.

The first and second via-holes 33-1 and 33-2 may broaden upward and may taper downward. In contrast, the third via-holes 42 may taper upward and may broaden downward.

The core layer 22, which is located lowermost, is preferably made of fiber-reinforced plastics (FRP). The core layer 22 is more preferably prepared from a copper-clad laminate such as a glass cloth base epoxy resin impregnated double-sided copper clad laminate.

The multilayer printed wiring board 20 of the first embodiment includes the first and second resin layers 26-1 and 26-2 as shown in FIG. 1. The multilayer printed wiring board 20 of the first embodiment is not limited to such a configuration and may include one or more resin layers disposed on the upper surface of the core layer 22.

(1) Since the first and second via-holes 33-1 and 33-2 are open in the direction opposite to the direction in which the third via-holes 42 are open, the first and second resin layers 26-1 and 26-2 are warped in the direction opposite to the direction in which the core layer 22 are warped; hence, the multilayer printed wiring board 20 of the first embodiment is hardly warped.

Since the multilayer printed wiring board 20 of the first embodiment is hardly warped by heating during the reflow of solder bumps, the distance between the multilayer printed wiring board 20 of the first embodiment and each semiconductor element is maintained substantially constant. Therefore, even if the multilayer printed wiring board 20 of the first embodiment has a semiconductor element-mounting region (that is, a region having pads connected to electrodes of the semiconductor elements) having a large area of 200 to 2,000 mm² and the number of the pads is 2,000 to 30,000, problems such as misconnections hardly occur.

(2) Since the core layer 22 typically includes the glass-based material, the core layer 22 has a smaller thermal expansion coefficient and a higher dimensional stability as compared to a layer made of only resin, for example, an epoxy resin. If semiconductor elements (not shown) are mounted on the second resin layer 26-2, the semiconductor elements, the second resin layer 26-2, the first resin layer 26-1, and the core layer 22 are arranged in that order. That is, the first and second resin layers 26-1 and 26-2 are sandwiched between the core layer 22 and the semiconductor elements having a thermal expansion coefficient which is less than those of the first and second resin layers 26-1 and 26-2. Therefore, the multilayer printed wiring board 20 of the first embodiment may reduce the occurrence of cracks during a temperature cycle test because the multilayer printed wiring board 20 is hardly warped.

(3) The core layer 22 is preferably prepared from the copper-clad laminate and uses the copper foils 23 as described above. For example, the core layer 22 is typically of a glass-cloth base epoxy-resin impregnated copper-clad laminate. When a copper-clad laminate is in general manufactured by a laminate maker, a surface of each copper foil 23 facing to a laminate 22 is usually matte-finished (roughened) such that the copper foil 23 is securely fixed to the copper-clad laminate 22. The microscopic observation of the copper foil 23 shows that the copper foil 23 has protrusions (anchors) 27 extending into the copper-clad laminate 22 as shown in the circles in FIG. 1. This allows the copper foil 23 to be tightly fixed to the copper-clad laminate 22.

That is, the adhesion between the copper foil 23 and the copper-clad laminate 22 is very strong. Hence, the multilayer printed wiring board 20 of the first embodiment is tough.

(4) The core layer 22 is preferably prepared from a glass cloth base epoxy-resin impregnated copper-clad laminate. The glass cloth base includes a plurality of sheets of woven glass fabric (not shown) with high dimensional stability against heat. Since the multilayer printed wiring board 20 of the first embodiment has the sheets of woven glass fabric, therefore it has high stiffness and is hardly warped.

(Method for Manufacturing)

A method for manufacturing the multilayer printed wiring board 20 of the first embodiment will now be described with reference to FIGS. 2A to 2R.

Figure 2A:
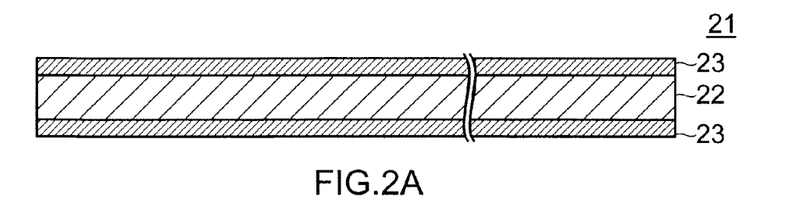
FIGS. 2A to 2R are illustrations showing steps of manufacturing the multilayer printed wiring board shown in FIG. 1.

As shown in FIG. 2A, a double-sided copper-clad laminate (for example, NEMA grade FR-4) 21 is prepared as starting material. The copper-clad laminate 22 for a core layer is preferably formed in such a manner that one sheet or two sheets (not shown) of woven glass fabric impregnated with a thermosetting epoxy resin is semi-cured. The copper-clad laminate 21 is then formed by cladding copper foils to both surfaces of the copper-clad laminate 22, respectively, and then these are heat-cured. For example, a glass cloth base epoxy-resin impregnated copper-clad laminate with a thickness of about 0.06 mm, including the copper foils 23 each having a thickness of about 12 µm may be used.

Alternatively, the following laminates may be used to manufacture the core layer 22: a laminate including a glass-based material impregnated with a bismaleimide triazine resin, a laminate including a glass-based material impregnated with a polyphenylene ether resin, or a laminate including a glass-based material impregnated with a polyimide resin. The core layer 22 preferably has a thickness of 0.03 mm to 0.40 mm. The thickness of the copper-clad laminate is more preferably is from 0.03 mm to 0.12 mm. This is because the warpage of the multilayer printed wiring board 20 of the first embodiment can be reduced due to the stiffness of the core layer 22 and the counter balance between the warpage of the core layer 22 and that of the first and second resin layers 26-1 and 26-2.

Figure 2B:
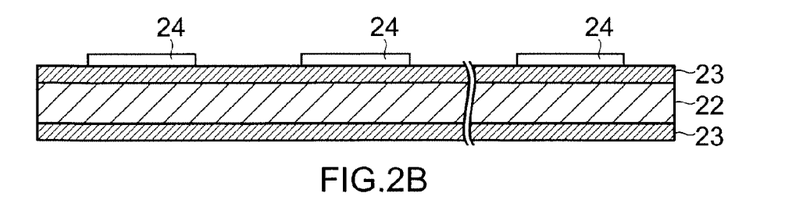

As shown in FIG. 2B, first etching resist layers 24 are provided on regions of the upper one of the copper foils 23. The first etching resist layers 24 may be formed in such a manner that, for example, a dry film is laminated on the upper copper foil 23 and then partly removed to form a conductive film by photolithography. Alternatively, the first etching resist layers 24 may be formed by screen printing using a liquid resist.

Figure 2C:
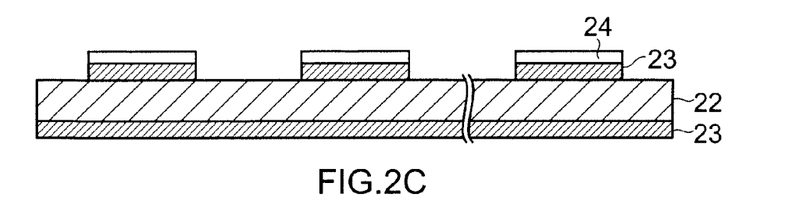

As shown in FIG. 2C, portions of the upper copper foil 23 that are exposed from the first etching resist layers 24 are removed by etching.

Figure 2D:
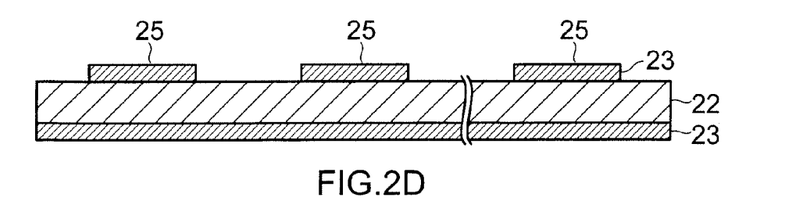

As shown in FIG. 2D, the first etching resist layers 24, disposed on the remaining portions of the upper copper foil 23, are removed, whereby a first conductive film 25 made of the upper copper foil 23 is formed. The conductive film includes one or more of a land, a signal conductive circuit, a power conductive circuit and/or a grand conductive circuit. The via-hole is formed on the land.

Figure 2E:
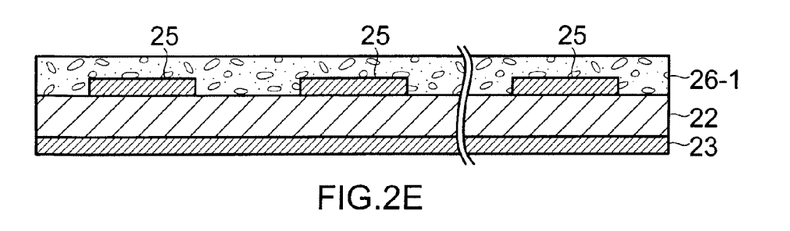

As shown in FIG. 2E, the first resin layer 26-1 is provided on the core layer 22. The first resin layer 26-1 may be formed in such a manner that an interlayer insulating resin film (for example, a film, grade ABF, available from Ajinomoto Fine-Techno. Co. Inc), a semi-cured resin sheet such as a prepreg and the like is attached to the core layer 22 and then heat-cured, or in such a manner that pre-cured resin is applied to the core layer 22 by screen printing and then heat-cured. A thickness of the first resin layer 26-1 may be from 0.02 mm to 0.06 mm. The thickness of the core layer may be equal to or thicker than the thickness of the first resin layer. Before the first resin layer 26-1 is formed, the surfaces (including side surfaces) of the first conductive film 25 may be roughened.

Figure 2F:
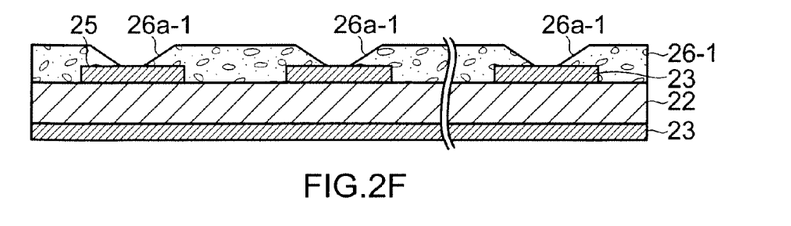

As shown in FIG. 2F, a first opening 26a-1 for forming the first via-hole 33-1 is formed in the first resin layer 26-1 by laser irradiation using, for example, a carbon dioxide laser such that the first opening 26a-1 is located above the respective conductive film 25 on the core layer. Since the conductive film 25 on the core layer functions as a stopper during the formation of the first opening 26a-1 by laser irradiation, the first opening 26a-1 reaches an upper surface of the conductive film 25 on the core layer. That is, the first via-hole 33-1 extends from an upper surface of the first resin layer 26-1 to the upper surface of the conductive film 25 on the core layer. The first opening 26a-1 may taper toward conductive film 25 on the core layer, that is, the first opening 26a-1 may have a downward tapered shape. Therefore, the first via-hole 33-1 may be, not rectangular, substantially trapezoidal in cross section.

An excimer laser, a YAG laser, or a UV laser may be used instead of the carbon dioxide laser. A protective film such as a PET film may be used during the formation of the first openings 26a-1 as required. This may be applied to the formation of openings below.

Figure 2G:
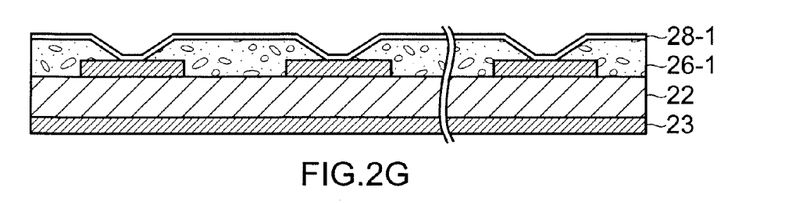

As shown in FIG. 2G, catalyst seeds for electroless plating are provided on the first resin layer 26-1 having the first opening 26a-1 and a first copper layer (an electroless plating film) 28-1 with a thickness of 0.6 to 3.0 μm is then formed on the first resin layer 26-1 by electroless plating. Before the first copper layer 28-1 is formed, the first resin layer 26-1 may be processed desmear as required such that resin residues are removed therefrom. Before the catalyst seeds for electroless plating, a surface of the first resin layer may be roughened.

Figure 2H:
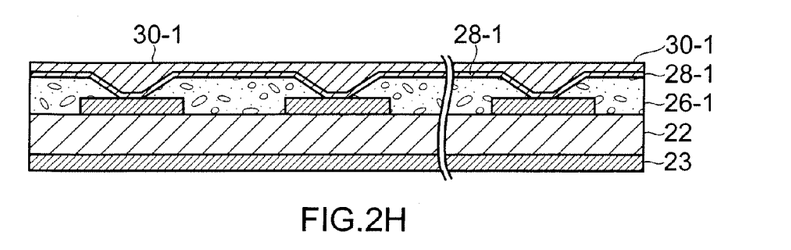

As shown in FIG. 2H, a second copper layer (an electroplating film) 30-1 with a thickness of, for example, several ten micrometers is formed on the first copper layer 28-1 by electroplating using the first copper layer 28-1 as a feeder, that is, an electrode. Alternatively, the second copper layer 30-1 may be formed by electrolytic solder plating. Alternatively, the first copper layer 28-1 and the second copper layer 30-1 may be entirely formed by electroless copper plating, then the second copper layer 30-1 may be flattened by an appropriate process as required.

Figure 2I:
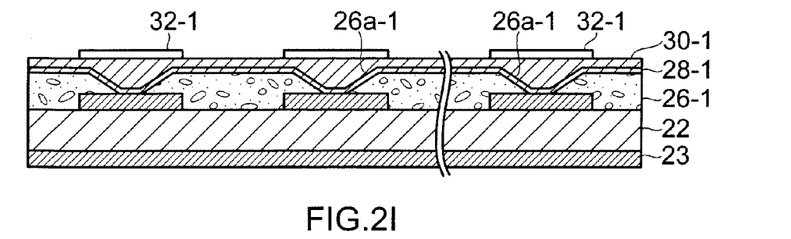

As shown in FIG. 2I, second etching resist layers 32-1 are provided on the second copper layer 30-1. For example, the second etching resist layers 32-1 may be formed by photolithography or screen printing as described above with reference to FIG. 2B.

Figure 2J:
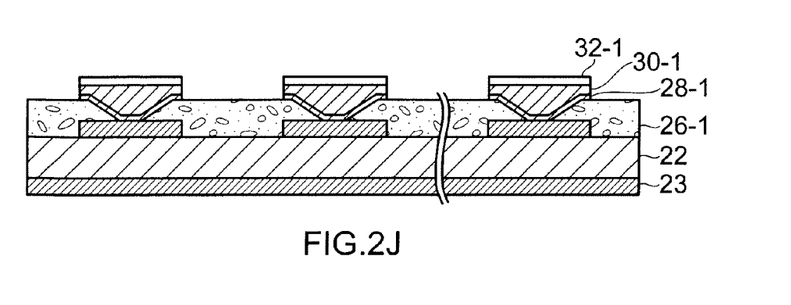

As shown in FIG. 2J, regions of the first and second copper layers 28-1 and 30-1 that are exposed from the second etching resist layers 32-1 are removed by etching.

Figure 2K:
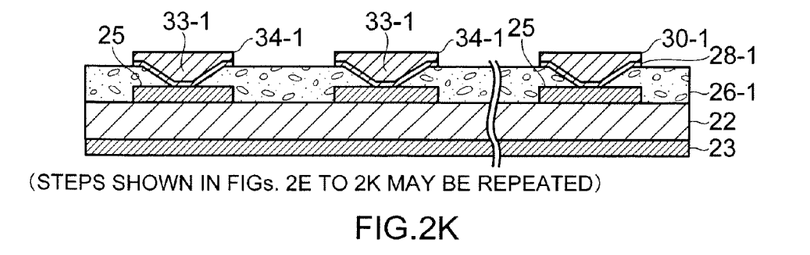

As shown in FIG. 2K, the second etching resist layers 32-1 on the remaining regions of the second copper layer 30-1 are removed, whereby a second conductive film 34-1 made of the first and second copper layers 28-1 and 30-1 is formed on the first resin layer 26-1. The second conductive film 34-1 is formed by a subtractive process as described above and may be formed by a known semi-additive process. The second conductive film includes one or more of a signal conductive circuit, a power conductive circuit, a grand conductive circuit and/or a land. In this step, the first via-hole 33-1 is formed such that the first conductive film 25 is electrically connected to the respective second conductive film 34-1. The first via-hole may be a filled via-hole which is substantially filled the first opening with the electroplating film. The first via-hole 33-1 may have a cross-sectional shape corresponding to that of the first opening 26a-1 described with reference to FIG. 2F, thus it may taper toward the conductive film on the core layer, therefore the first via-hole 33-1 has substantially an inversed frusto-conical shape. The first via-hole has a bottom surface contacting the conductive film 25 on the core layer, and the bottom surface has a diameter which is from 40 μm to 150 μm.

At the point of time when this step is finished, the second conductive film 34-1 is formed on the first resin layer 26-1 and the first via-hole 33-1 is formed in the first resin layer. Therefore, a desired number of resin layers may be formed on the first resin layer 26-1 by repeating the steps shown in FIGS. 2E to 2K. In this embodiment, these steps are repeated one more time. The second via-hole 33-2 has a bottom surface contacting the conductive film on the first resin layer and the bottom surface has a diameter which is from 40 μm to 150 μm.

Figure 2L:
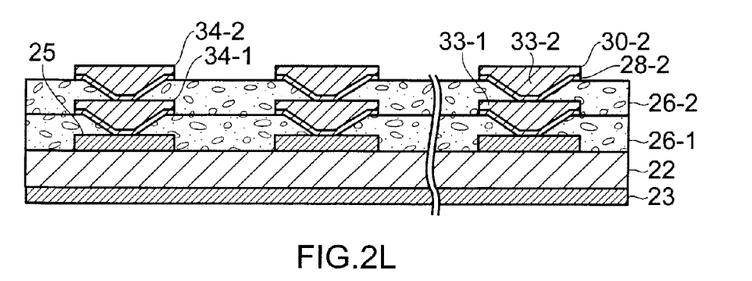

As shown in FIG. 2L, the second resin layer 26-2 is formed on the first resin layer 26-1 by repeating the steps shown in FIGS. 2E to 2K once. A thickness of the second resin layer 26-1 may be from 0.02 mm to 0.06 mm. The thickness of the second resin layer is equal to or thinner than thickness of the core layer. A second opening in the second resin layer for the second via-hole 33-2 may taper toward the second conductive film 34-1. The second via-hole has a contacting surface contacting the second conductive film 34-1 on the first resin layer and having a diameter which is from 40 μm to 150 μm.

Figure 2M:
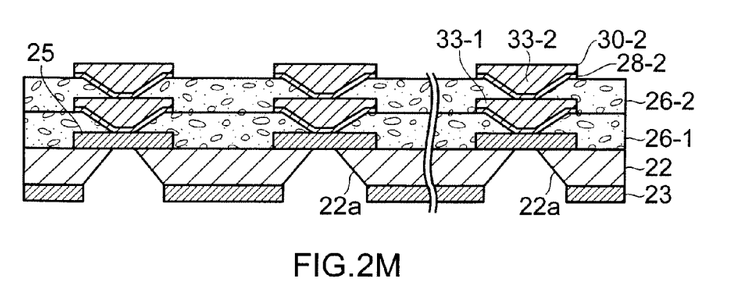

As shown in FIG. 2M, a third opening 22a for forming the third via-hole 42 is formed in the core layer 22 in such a manner that the lower one of the copper foils 23 is partly removed by photolithography and regions of the lower surface of the core layer 22 exposed are then irradiated with a laser beam. This process is so-called a conformal process. In this step, the conductive film 25 functions as stopper, hence, the third opening 22a reaches to the lower surface of the conductive film 25. Therefore, the third opening 22a is open in the direction opposite to the direction in which the first opening 26a-1 in the first resin layer 26-1 and the second opening 25a-2 in the second resin layer 26-2 are open. The third opening 22a may taper toward the conductive film 25 on the core layer, that is, the third opening 22a may have an upward tapered shape.

Figure 2N:
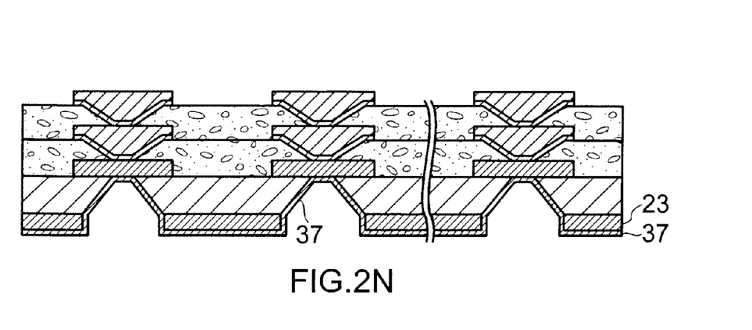

As shown in FIG. 2N, a third copper layer (an electroless plating film) 37 is formed over the remaining regions of the lower copper foil 23 and the core layer 22 having the third opening 22a by electroless copper plating. Before the third copper layer 37 is formed, catalyst seeds for electroless plating may be provided on the core layer 22 by, for example, sputtering or plating as required.

Figure 2O:
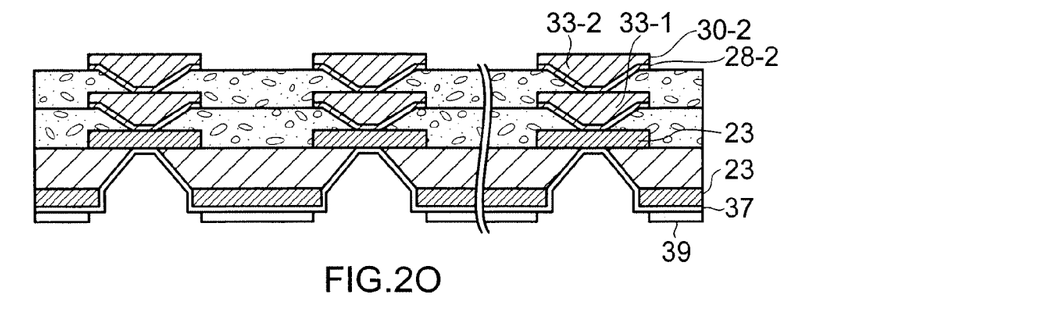

As shown in FIG. 2O, plating resist layers 39 are provided on the third copper layer 37. The plating resist layers 39 may be formed by photolithography or screen printing as described above with reference to FIG. 2B.

Figure 2P:
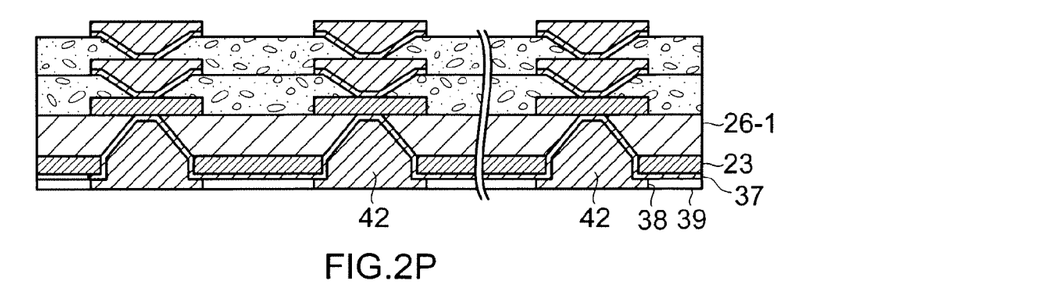

As shown in FIG. 2P, a fourth copper layer (an electroplating film) 38 is formed on the third copper layer 37 by electroplating using the third copper layer 37 as a feeder, whereby the third via-hole 42 is formed. The third via-hole 42 is open in the direction opposite to the direction in which the first via-hole 33-1 and second via-hole 33-2 shown in FIGS. 2K and 2L are open. The third via-holes 42 may taper toward conductive film 25 on the core layer. The third via-hole may be a filled via-hole which is filled the third opening substantially with the electroplating film. The third and fourth copper layers 37 and 38 may be entirely formed by electroless copper plating. The third via-hole has a bottom surface contacting the conductive film 25 on the core layer and the bottom surface has a diameter which is from 60 μm to 250 μm. The diameter of the bottom surface of the third via-hole is larger than those of the first and second via-holes.

Figure 2Q:
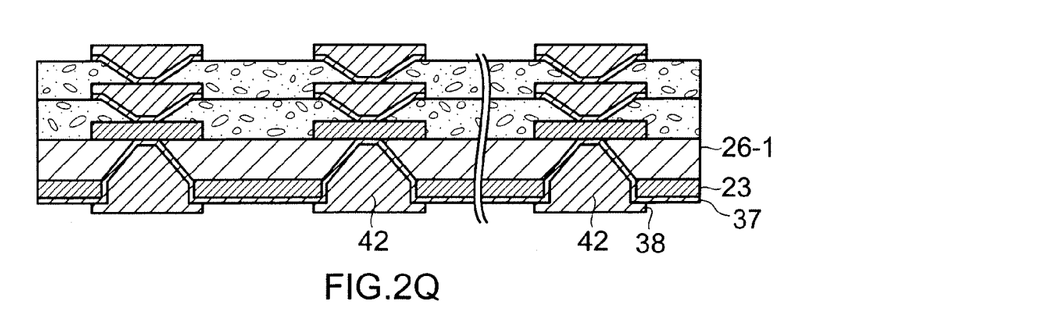

As shown in FIG. 2Q, the plating resist layers 39 disposed on the third copper layer 37 are removed.

Figure 2R:
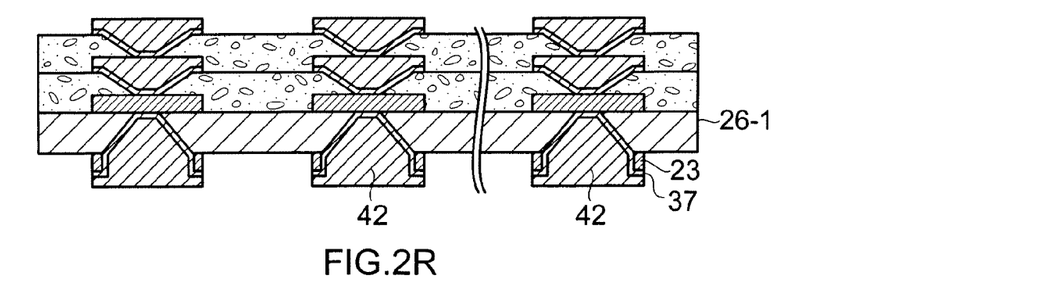

As shown in FIG. 2R, the third copper layer 37 and the remaining regions of the lower copper foil 23 are removed by etching. At this time, appropriate etching resist layers may be formed on the fourth copper layers 37, a third conductive film 30-2 formed on the second resin layer 26-2 and the second via-hole 33-2. These etching resist layers are then removed. Regions other than sections for soldering pads disposed on one or both surfaces of the multilayer printed wiring board 20 may be covered with a solder resist (not shown) such that the formation of solder bridges is prevented. According to the above procedure, the multilayer printed wiring board 20 shown in FIG. 1 can be manufactured.

Second Embodiment

Figure 3:
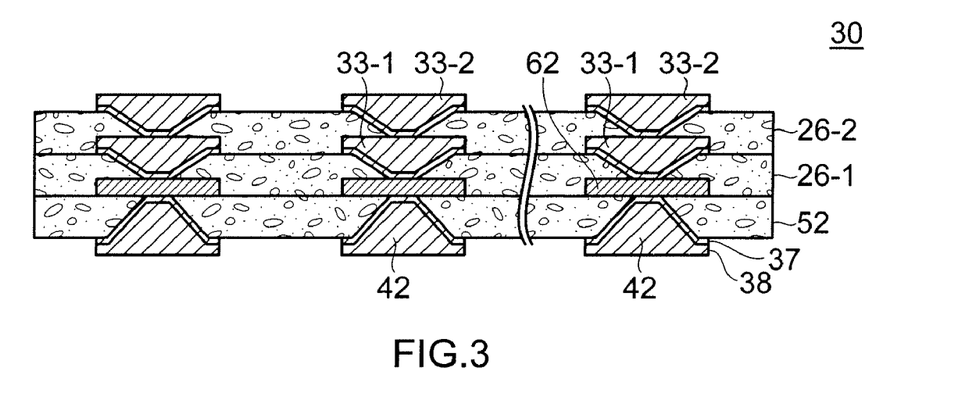
FIG. 3 is a sectional view of a multilayer printed wiring board according to a second embodiment of the present invention.

FIG. 3 shows a multilayer printed wiring board 30 according to a second embodiment of the present invention. That is, the multilayer printed wiring board 30 of this embodiment includes a third resin layer (a coreless layer) 52 including no core material such as a glass cloth. The multilayer printed wiring board 30 of this embodiment further may include the first via-hole 33-1 and the second via-hole 33-2 similar to those included in the multilayer printed wiring board 20 of the first embodiment.

The third resin layer (coreless layer) 52 has substantially the same configuration as those of the first resin layer 26-1 and the second resin layer 26-2 included in the multilayer printed wiring board 30 of this embodiment. The multilayer printed wiring board 30 of this embodiment is superior in flexibility. Hence, the multilayer printed wiring board 30 of this embodiment can readily absorb the expansion or shrinkage of a wiring board during solder reflow.

(1) The multilayer printed wiring board 30 of the second embodiment is hardly warped by heat during solder reflow; hence, a problem such as a faulty connection between a semiconductor device and a printed board hardly occurs.

(2) Since the multilayer printed wiring board 30 of the second embodiment is flexible and readily absorbs the expansion of such a wiring board during solder reflow. Therefore, the multilayer printed wiring board 30 of the second embodiment absorbs a difference in thermal expansion coefficient between a semiconductor element and a printed wiring board 30 of the second embodiment, hence, cracks due to such a difference are hardly formed.

The second embodiment of the invention is not limited to this configuration. The multilayer printed wiring board 30 of the second embodiment may include three or more resin layers as required.

A method for manufacturing the multilayer printed wiring board 30 of the second embodiment shown in FIG. 3 will now be described with reference to FIGS. 4A to 4T. If some of steps shown in FIGS. 4A to 4T are substantially identical to those shown in FIGS. 2A to 2R, the facts will be described and the descriptions of the identical steps will be omitted.

Figure 4A:
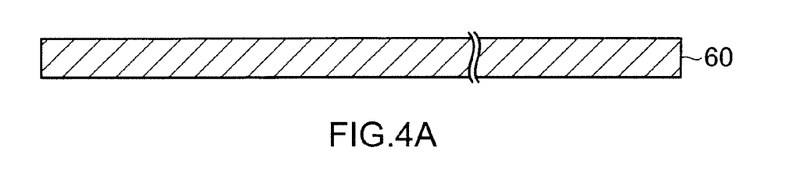
FIGS. 4A to 4T are illustrations showing steps of manufacturing the multilayer printed wiring board shown in FIG. 3.

As shown in FIG. 4A, a support plate 60 is prepared as starting material. The support plate 60 is preferably made of copper.

Figure 4B:
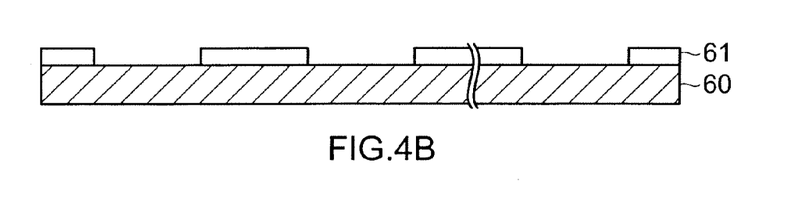

As shown in FIG. 4B, plating resist layers 61 are provided on the upper surface of the support plate 60. The plating resist layers 61 may be formed in such a manner that, for example, a dry film is laminated on the support plate 60 and then patterned by photolithography. Alternatively a liquid resist may be applied onto the support plate 60 by screen printing to form the plating resist layers 61.

Figure 4C:
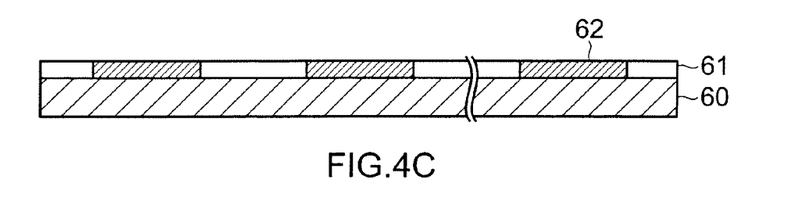

As shown in FIG. 4C, conductive films 62 are formed on regions of the support plate 60 other than the plating resist films 61 by electrolytic plating using the support plate 60 as a feeder. Before the conductive films 62 are formed, a thin film (not shown) including, for example, a thin film of Cr and a thin film of Ti may be formed on the upper surface of the support plate 60. The thin film may not be etched off by an etchant used to etch the support plate 60 in a step shown in FIG. 4M and therefore function as etching stoppers.

Figure 4D:
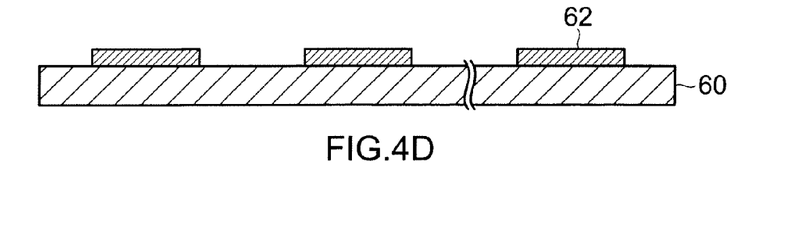

As shown in FIG. 4D, the plating resist layers 61 formed on the upper surface of the support plate 60 are removed, such that the conductive film 62 is formed. The conductive film has one or more of a land, a signal conductive circuit, a power conductive circuit and/or a grand conductive circuit.

Figure 4E:
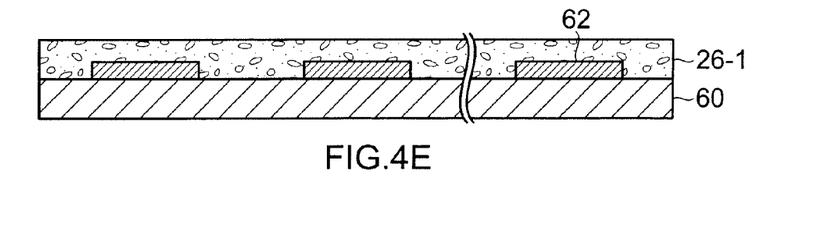
Figure 4F:
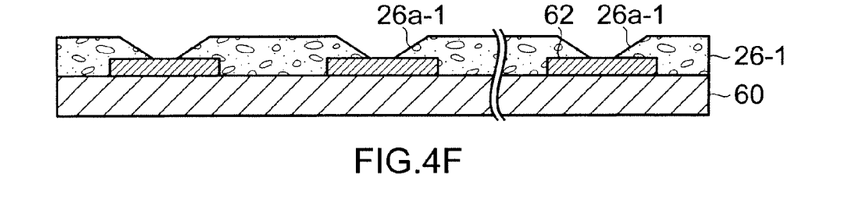
Figure 4G:
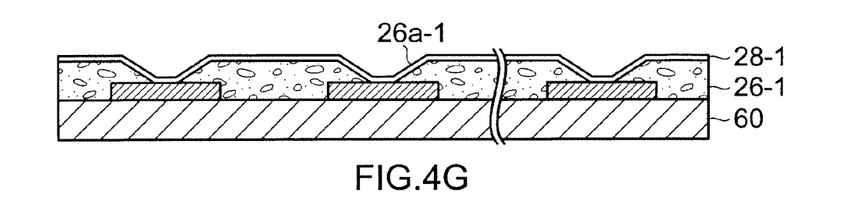
Figure 4H:
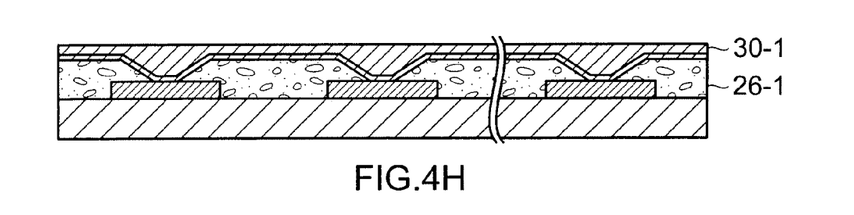
Figure 4I:
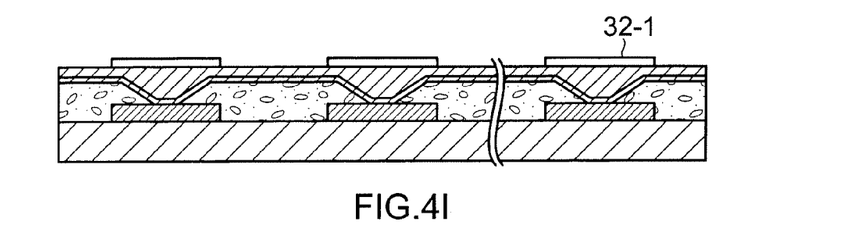
Figure 4J:
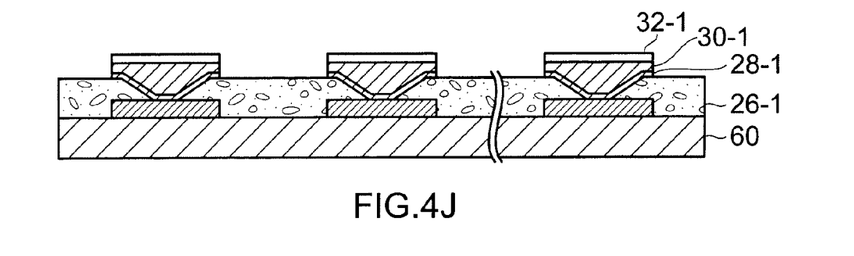

A step of forming a first resin layer 26-1 on the support plate 60 as shown in FIG. 4E is substantially identical to the step shown in FIG. 2E. A thickness of the first resin layer may be from 0.02 mm to 0.06 mm. An opening-forming step performed as shown in FIG. 4F is substantially identical to the step shown in FIG. 2F. The opening 26a-1 in the first resin layer 26-1 may taper toward the conductive film 62. An electroless plating step performed as shown in FIG. 4G is substantially identical to the step shown in FIG. 2G. An electrolytic plating step performed as shown in FIG. 4H is substantially identical to the step shown in FIG. 2H. An etching resist-forming step performed as shown in FIG. 4I is substantially identical to the step shown in FIG. 2I. An etching step performed as shown in FIG. 4J is substantially identical to the step shown in FIG. 2J. An etching resist-removing step performed as shown in FIG. 4K is substantially identical to the step shown in FIG. 2K.

Figure 4K:
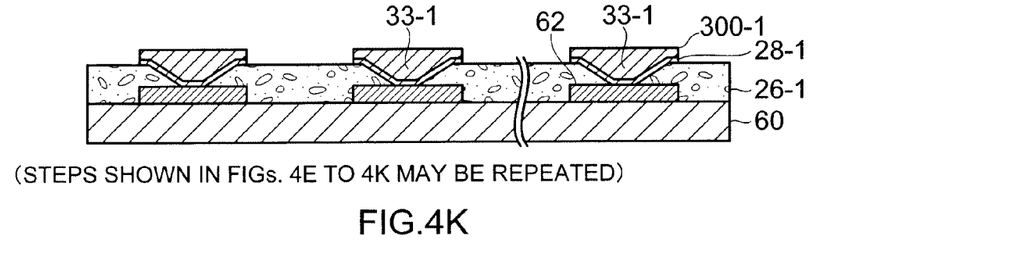

In the stage in FIG. 4K, an upper conductive film 300-1 is formed on the first resin layer and the first via-hole 33-1 is formed in the first resin layer. The first via-hole 33-1 may taper toward the conductive film 62. The first via-hole has a bottom surface contacting the conductive film 62 and the bottom surface has a diameter which is from 40 μm to 150 μm. A necessary number of resin layers can be formed on the first resin layer 26-1 by repeating the steps shown in FIGS. 4E to 4K necessary times. In this embodiment, these steps are repeated one more time.

Figure 4L:
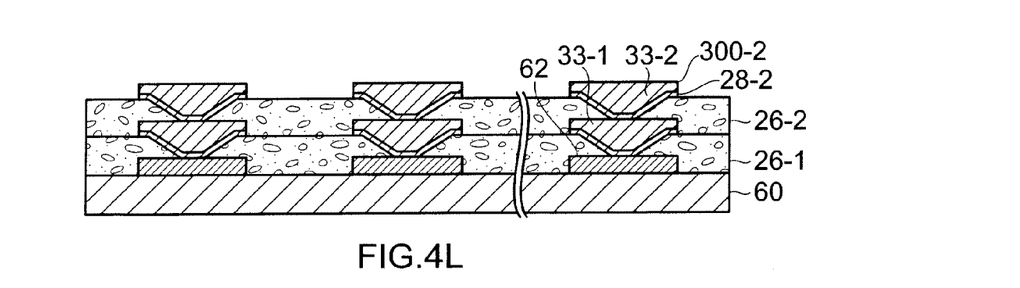

As shown in FIG. 4L, a second resin layer 26-2 having second via-hole 33-2 is formed on the first resin layer 26-1 by repeating the steps shown in FIGS. 4E to 4K once. A thickness of the second resin layer is from 0.02 mm to 0.06 mm. An opening for the second via-hole may taper toward the upper conductive film 300-1. The second via-hole has a bottom surface contacting the upper conductive film 300-1 and the bottom surface has a diameter which is from 40 μm to 150 μm. As shown in FIG. 4L, an outermost conductive film 300-2 is formed on the second resin layer.

Figure 4M:
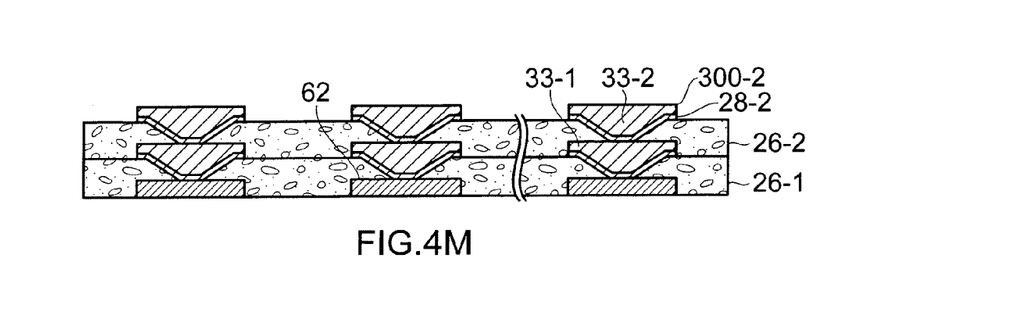

As shown in FIG. 4M, the support plate 60 is removed by etching. In the step, the thin film described above with reference to FIG. 4C may be used as an etching stopper.

Figure 4N:
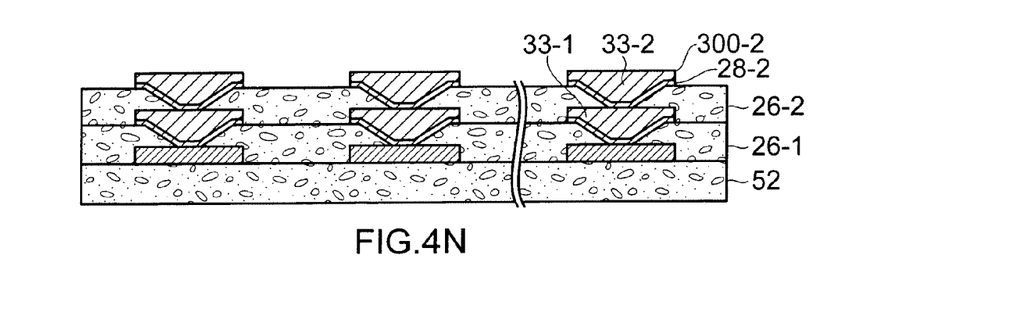

As shown in FIG. 4N, a third resin layer (coreless layer) 52 is provided on the lower surface of the first resin layer 26-1. The third resin layer 52 may be formed in such a manner that a semi-cured resin sheet, a resin film or the like is attached to the first resin layer 26-1 and then heat-cured, or in such a manner that a pre-cured resin is applied to the first resin layer 26-1 by screen printing and then cured. A thickness of the third resin layer (coreless layer) is from 0.03 mm to 0.4 mm.

Figure 4O:
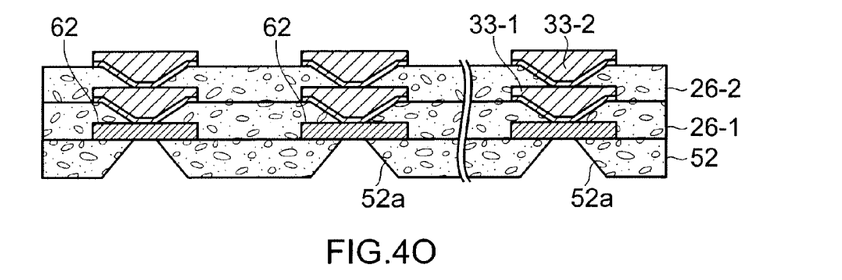

As shown in FIG. 4O, a third opening 52a reaching to the conductive film on the coreless layer is formed in the third resin layer to form a third via-hole 42. In this step, the conductive film 62 functions as stopper; hence, the opening 52a reaches to the lower surfaces of the conductive film 62. The opening 52a in the core less layer may tapers toward the conductive film 62, that is, the opening 52a may have an upward tapered shape. As described above, the step shown in FIG. 4O is substantially identical to that shown in FIG. 2M except for the absence of the copper foils 23.

Figure 4P:
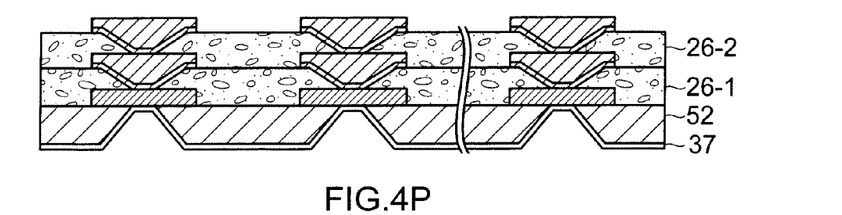
Figure 4Q:
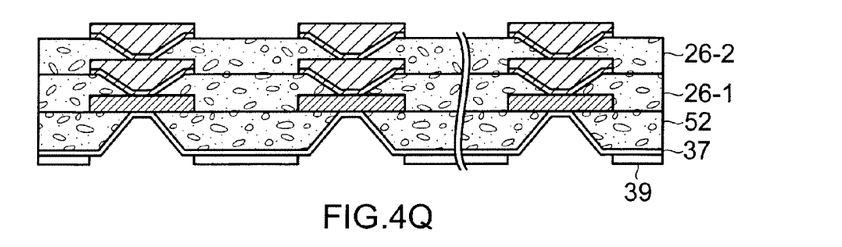
Figure 4R:
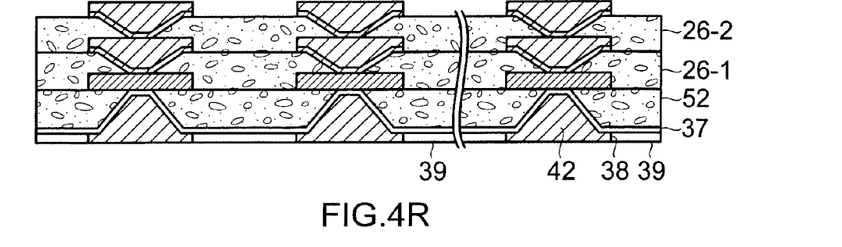
Figure 4S:
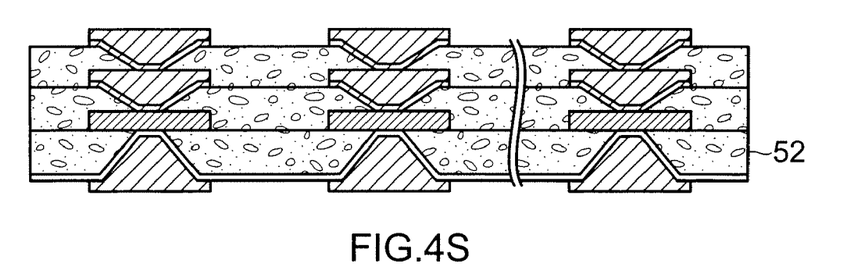
Figure 4T:
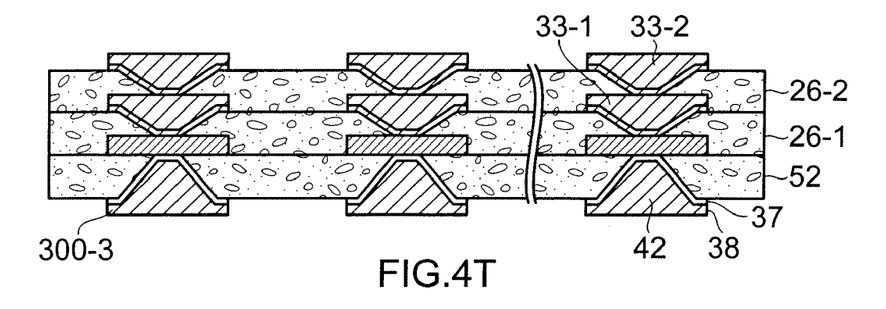

An electroless plating step performed as shown in FIG. 4P is substantially identical to the step shown in FIG. 2N. A plating resist-forming step performed as shown in FIG. 4Q is substantially identical to the step shown in FIG. 2O. An electrolytic plating step performed as shown in FIG. 4R is substantially identical to the step shown in FIG. 2P. A plating resist-removing step performed as shown in FIG. 4S is substantially identical to the step shown in FIG. 2Q.

As shown in FIG. 4T, an electroless plating layer 37 is removed by quick etching. A third conductive film 300-3 is formed. In this step, etching resist layers may be used to cover the third conductive film 300-3 and/or the second conductive film 300-2 and/or the second via-hole 33-2. The first via-hole has a bottom surface contacting the conductive film 62 on the coreless layer, and the bottom surface of the first via-hole has a diameter which may be from 40 µm to 150 µm. The second via-hole has a bottom surface contacting the conductive film 300-2 on the first resin layer and the bottom surface of the second via-hole has a diameter which may be from 40 µm to 150 µm. The third via-hole has a bottom surface contacting the conductive film 62 on the coreless layer, and the bottom surface of the third via-hole has a diameter which may be from 60 µm to 250 µm. The diameter of the bottom surface of the first and second via-holes may be smaller than one of the bottom surface of the coreless layer.

According to the above procedure, the multilayer printed wiring board 30 of the second embodiment shown in FIG. 3 may be manufactured.

[Others]

The embodiments describe above are for exemplification and should not in any way be construed as limitative. The present invention covers modifications, variations, and substitutes readily made by those skilled in the art.

(1) The manufacturing steps described above are current typical examples. Hence, materials, manufacturing conditions, and the like used in the manufacturing steps may be varied depending on various circumstances.

(2) In the embodiments described above, the semiconductor elements are mounted on the upper surfaces of the multilayer printed wiring boards as one example. However, the embodiment of the present invention cover multilayer printed wiring boards including semiconductor elements mounted on the lower surfaces or both surfaces thereof.

(3) The multilayer printed wiring boards 20 and 30 of the embodiment shown in FIG. 1 or 3 each include the first and second resin layers 26-1 and 26-2. However, the number of resin layers included in a multilayer printed wiring board of the embodiment according to the present invention is not limited to two and may be three or more. Alternatively, such a multilayer printed wiring board may include a single resin layer as shown in FIG. 5.

(4) A method for manufacturing a multilayer printed wiring board of the embodiment according to the present invention may include a step of attaching two copper-clad laminates or support plates to each other with an adhesive such as wax and a step of removing the copper-clad laminates or the support plates, the removing step being subsequent to a step of forming portions such as via-holes and conductive films. The adhesive is not melted or softened at a process temperature during manufacturing steps but is melted or softened at a temperature lower than a temperature at which the multilayer printed wiring board is deteriorated.

Figure 5:
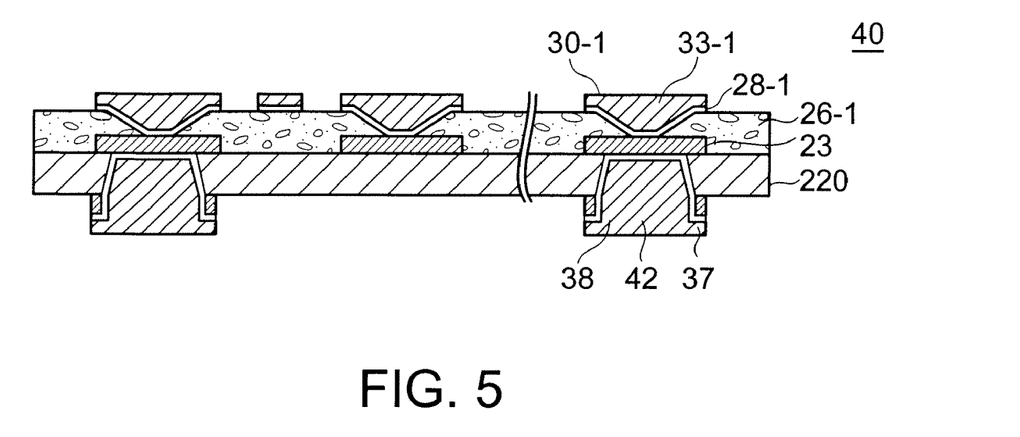
FIG. 5 is a sectional view of one embodiment of the present invention.

Referring to FIG. 5, a multilayer printed wiring board 40 of the third embodiment has an insulating layer 220 having an opening. A conductive film 23 made of, for example Cu, Au, Ag, Ni, W, is formed on the upper surface of the insulating layer and is closing one end of the opening of the insulating layer. A resin layer 26-1 made of, for example, epoxy, polyimide, or a mixture made of thermosetting resin and thermoplastic resin, is formed on the insulating layer 220 and the conductive film 23 and has at least one opening. The opening in the resin layer 26-1 may or may not be connected to the conductive film 23. A via-hole structure 42 is formed in the opening of the insulating layer 220 and has an electroless plating film 37 and an electroplating film 38. The electroless plating film 37 is formed on the surface of the opening of the insulating layer and the surface of the conductive film 23, and the electroplating film 38 is formed on the electroless plating film 37. Another via-hole structure 33-1 is formed in the at least one opening of the resin layer 26-1 and has an electroless plating film 28-1 and an electroplating film 30-1. The electroless plating film 28-1 is formed on the surface of the opening of the resin layer and the electroplating film 30-1 is formed on the electroless plating film 28-1. The electroless plating film 28-1 of the via-hole structure 33-1 may be formed on the surface of the conductive film. Thus, on the upper surface of the conductive film, one via-hole structure having an electroless plating film and an electroplating film in this order is formed, and on the lower surface of the conductive film, the other via-hole structure having an electroless plating film and an electroplating film in this order is formed. By providing such a structure, stress due to those plating films on the multilayered printed wiring board is reduced significantly. The insulating layer 220 may be a core layer or a coreless layer. The core layer has a resin and a core material such as a glass cloth or a glass fiber, and the core layer may be a single-side or a double-side copper-clad laminate. For example, the core layer may be made of a glass cloth base epoxy-resin impregnated copper-clad laminate, a glass-based material impregnated with a bismaleimide triazine resin, a laminate including a glass-based material impregnated with a polyphenylene ether resin, or a laminate including a glass-based material impregnated with a polyimide resin. The coreless layer has a resin layer without the core material. For example, the coreless layer may be made of a resin layer, such as epoxy, or polyimide, without the core layer. The multilayer printed wiring board 40 of the third embodiment may be manufactured by the steps shown in FIGS. 2A to 2R without repeating the steps shown in FIGS. 2E to 2K. As another method, the multilayer printed wiring board 40 of the third embodiment may be manufactured by the steps shown in FIGS. 4A to 4T without repeating the steps shown in FIGS. 4E to 4K. The via-hole structures 42, 33-1 may taper toward the conductive film 23. A thickness of the resin layer 26-1 may be from 0.02 mm to 0.06 mm. A thickness of the insulating layer 220 may be from 0.03 mm to 0.4 mm. The thickness of the insulating layer may be equal to or thicker than one of the resin layers. The via-hole structure 33-1 has a bottom surface contacting the conductive film 23 on the insulating layer and the bottom surface of the via-hole structure 33-1 has a diameter which may be from 40 µm to 150 µm. The via-hole structure 42 has a bottom surface contacting the conductive film 62 on the coreless layer, and the bottom surface of the via-hole structure 42 has a diameter which may be from 60 µm to 250 µm. The diameter of the bottom surface of the via-hole structure 42 may be larger than one of the bottom surface of via-hole structure 33-1. The via-hole structures 42, 33-1 may taper toward the conductive film 23.

Specifically, in the method of the first embodiment, the steps shown in FIGS. 2A to 2L may be applied to each of two copper-clad laminates 21 including copper foils 23 attached to each other such that the copper foils 23 are fixed to each other with an adhesive. In the method of the second embodiment as well as the method of the first embodiment, the steps shown in FIGS. 4A to 4L may be applied to each of two support plates or copper plates 60 attached to each other with an adhesive. Then, two printed boards obtained are separated from each other and separately processed in subsequent steps.

According to this procedure, since the two copper-clad laminates 21 or support plates 60 are fixed to each other with such an adhesive, the two copper-clad laminates or support plates can be processed into the two printed boards simultaneously or successively, whereby two multilayer printed wiring boards may be manufactured at once. The two multilayer printed wiring boards fixed to each other are heated to a temperature at which the adhesive is melted or softened, whereby the two multilayer printed wiring boards are separated from each other. The resulting two multilayer printed wiring boards are then separately processed in subsequent steps.

The scope of the present invention is defined by the appended claims.

What is claimed is:

1. A multilayer printed wiring board comprising:
   a lowermost insulating layer comprising a core layer and forming an outermost insulating layer having a via-hole structure;
   a conductive film formed on a surface of the lowermost insulating layer;
   a first via-hole structure comprising a plating material and formed through the lowermost insulating layer;
   a first resin layer formed over the surface of the lowermost insulating layer and the conductive film;
   a second via-hole structure comprising a plating material and formed through the first resin layer;
   a second resin layer formed on a surface of the first resin layer; and
   a third via-hole structure comprising a plating material and formed through the second resin layer,
   wherein the second via-hole structure through the first resin layer is tapered in a direction opposite to a direction in which the first via-hole structure through the lowermost insulating layer is tapered, the conductive film is sandwiched between the first via-hole structure and the second via hole structure, the first via-hole structure and the second via hole structure are in contact with the conductive film, and the third via-hole structure through the second resin layer is tapered in the direction opposite to the direction in which the first via-hole structure through the lowermost insulating layer is tapered.

2. The multilayer printed wiring board according to claim 1, wherein the first and second via-hole structures are filled with a conductor.

3. The multilayer printed wiring board according to claim 1, wherein the second via-hole structure through the first resin layer tapers toward the conductive film, and the first via-hole structure through the lowermost insulating layer tapers toward the conductive film.

4. The multilayer printed wiring board according to claim 1, wherein the core layer is made of fiber-reinforced plastics.

5. The multilayer printed wiring board according to claim 1, wherein the core layer includes a substrate prepared by impregnating a woven glass fabric or a nonwoven aramid fabric with an epoxy resin or a bismaleimide-triazine resin and then subjecting the resin to curing.

6. The multilayer printed wiring board according to claim 1, wherein the core layer has a glass fabric having a two-ply construction.

7. A multilayer printed wiring board comprising:
   a lowermost insulating layer comprising a core layer and forming an outermost insulating layer having a via-hole structure;
   a conductive film formed on a surface of the lowermost insulating layer;
   a first resin layer formed over the lowermost insulating layer and the conductive film;
   a first via-hole structure formed through the lowermost insulating layer and comprising an electroless plating film and an electroplating film formed on the electroless plating film; and
   a second via-hole structure formed through the first resin layer and comprising an electroless plating film and an electroplating film formed on the electroless plating film;
   a second resin layer formed on a surface of the first resin layer; and
   a third via-hole structure comprising a plating material and formed through the second resin layer,
   wherein the second via-hole structure through the resin layer is tapered in a direction opposite to a direction in which the first via-hole structure through the lowermost insulating layer is tapered, the conductive film is sandwiched between the first via-hole structure and the second via hole structure, the first via-hole structure and the second via-hole structure are in contact with the conductive film, and the third via-hole structure through the second resin layer is tapered in the direction opposite to the direction in which the first via-hole structure through the lowermost insulating layer is tapered.

8. The multilayer printed wiring board according to claim 7, wherein the first via hole structure formed though the lowermost insulating layer tapers toward the conductive film, and the second via-hole structure formed through the first resin layer tapers toward the conductive film.

9. The multilayer printed wiring board according to claim 7, wherein a thickness of the lowermost insulating layer is equal to or thicker than a thickness of the first resin layer.

10. The multilayer printed wiring board according to claim 9, wherein the thickness of the lowermost insulating layer is from 0.03 mm to 0.4 mm, and the thickness of the first resin layer is from 0.02 mm to 0.06 mm.

11. The multilayer printed wiring board according to claim 7, wherein the first via-hole structure has a contacting surface contacting the conductive film and having a diameter, the second via-hole structure has a contacting surface contacting the conductive film and having a diameter, and the diameter of the contacting surface of the first via-hole structure is larger than the diameter of the contacting surface of the second via-hole structure.

12. The multilayer printed wiring board according to claim 11, the diameter of the contacting surface of the first via-hole structure is from 60 μm to 250 μm, and the diameter of the contacting surface of the second via-hole structure is from 40 μm to 150 μm.

* * * * *